(12) United States Patent
Kim et al.

(10) Patent No.: US 8,823,029 B2
(45) Date of Patent: Sep. 2, 2014

(54) LIGHT EMITTING DEVICE AND METHOD OF MANUFACTURING THE SAME

(75) Inventors: Sun Kyung Kim, Yongin-si (KR); Jin Wook Lee, Seoul (KR); Hyun Kyong Cho, Gwacheon-si (KR)

(73) Assignee: LG Innotek Co., Ltd., Seoul (KR)

( * ) Notice: Subject to any disclaimer, the term of this patent is extended or adjusted under 35 U.S.C. 154(b) by 82 days.

(21) Appl. No.: 13/240,927

(22) Filed: Sep. 22, 2011

(65) Prior Publication Data

US 2012/0012859 A1 Jan. 19, 2012

Related U.S. Application Data

(63) Continuation of application No. 12/622,271, filed on Nov. 19, 2009, now Pat. No. 8,049,239.

(30) Foreign Application Priority Data

Nov. 26, 2008 (KR) ........................ 10-2008-0117851

(51) Int. Cl.
*H01L 33/22* (2010.01)
*H01L 33/20* (2010.01)

(52) U.S. Cl.
CPC ................ *H01L 33/20* (2013.01); *H01L 33/22* (2013.01); *H01L 2933/0083* (2013.01)
USPC .................. 257/98; 257/91; 257/94; 257/436

(58) Field of Classification Search
USPC ......................................... 257/91
See application file for complete search history.

(56) References Cited

U.S. PATENT DOCUMENTS

| 6,831,302 | B2 | 12/2004 | Erchak et al. | |
|---|---|---|---|---|
| 2003/0132445 | A1* | 7/2003 | Yoshitake et al. | 257/84 |
| 2004/0016936 | A1 | 1/2004 | Tanaka et al. | |
| 2005/0173714 | A1 | 8/2005 | Lee et al. | |
| 2006/0204865 | A1 | 9/2006 | Erchak et al. | |
| 2006/0234408 | A1 | 10/2006 | Lee et al. | |
| 2006/0267034 | A1 | 11/2006 | Orita | |
| 2007/0018183 | A1 | 1/2007 | Denbaars et al. | |
| 2007/0077668 | A1 | 4/2007 | Kim | |
| 2007/0257269 | A1 | 11/2007 | Cho et al. | |
| 2007/0262330 | A1 | 11/2007 | Lee et al. | |

(Continued)

FOREIGN PATENT DOCUMENTS

| CN | 1552103 A | 12/2004 |
|---|---|---|
| EP | 1387413 A2 | 2/2004 |

(Continued)

*Primary Examiner* — Matthew W Such
*Assistant Examiner* — Abul Kalam
(74) *Attorney, Agent, or Firm* — Birch, Stewart, Kolasch & Birch, LLP (57) ABSTRACT

Provided are a light emitting device and a method of manufacturing the same. A light emitting device includes an active layer; a first conductive semiconductor layer on the active layer; a second conductive semiconductor layer on the active layer so that the active layer is disposed between the first and second conductive semiconductor layers; and a photonic crystal structure comprising a first light extraction pattern on the first conductive semiconductor layer having a first period, and second light extraction pattern on the first conductive semiconductor layer having a second period, the first period being greater than λ/n, and the second period being identical to or smaller than λ/n, where n is a refractive index of the first conductive semiconductor layer, and λ is a wavelength of light emitted from the active layer.

17 Claims, 5 Drawing Sheets

(56) References Cited

U.S. PATENT DOCUMENTS

| | | | |
|---|---|---|---|
| 2008/0035953 A1* | 2/2008 | Beom et al. | 257/103 |
| 2008/0042149 A1* | 2/2008 | Yoon et al. | 257/79 |
| 2009/0311817 A1 | 12/2009 | Yoon et al. | |
| 2010/0090242 A1 | 4/2010 | Cho et al. | |

FOREIGN PATENT DOCUMENTS

| | | |
|---|---|---|
| EP | 1855327 A2 | 11/2007 |
| JP | 2007-305998 A | 11/2007 |
| KR | 10-2004-0090465 A | 10/2004 |
| KR | 10-0593939 B1 | 6/2006 |
| KR | 10-2007-0008745 A | 1/2007 |
| KR | 10-2007-0110688 A | 11/2007 |
| KR | 10-2008-0015192 A | 2/2008 |
| KR | 10-2008-0093558 A | 10/2008 |
| KR | 10-0865754 B1 | 10/2008 |
| WO | WO 01/41225 A2 | 6/2001 |
| WO | WO 02/061847 A3 | 8/2002 |
| WO | WO 2006/096767 A1 | 9/2006 |

* cited by examiner

LIGHT EMITTING DEVICE AND METHOD OF MANUFACTURING THE SAME

CROSS-REFERENCE TO RELATED APPLICATIONS

The present application is a continuation of pending U.S. application Ser. No. 12/622,271 filed on Nov. 19, 2009, now U.S. Pat. No. 8,049,239 which claims priority under 35 U.S.C. 119 to Korean Patent Application No. 10-2008-0117851 filed on Nov. 26, 2008, each of which is hereby incorporated by reference in its entirety.

BACKGROUND OF THE INVENTION

Embodiments of the present invention relate to a light emitting device and a method of manufacturing the same.

The wavelength of light emitted from a light emitting diode depends on the semiconductor material used to manufacture the light emitting diode. This is because the wavelength of emitted light depends on the band-gap of a semiconductor material that represents an energy difference between valence band electrons and conduction band electrons.

With recent increases in luminance of light emitting diodes, the light emitting diodes are being used as light sources for displays, vehicles, and illumination devices. Also, light emitting diodes that emit a highly efficient white colored light can be implemented by using a fluorescent substance or by combining various colors of light emitting diodes.

On the other hand, the luminance of a light emitting diode depends on various conditions such as the structure of an active layer, a light extraction structure that extracts light to the outside, chip size, and the type of molding member surrounding a light emitting diode.

SUMMARY OF THE INVENTION

Embodiments of the present invention provide a light emitting device having new light extraction structure, and a method of manufacturing the same.

Embodiments of the present invention also provide a light emitting device having improved light extraction efficiency, and a method of manufacturing the same.

In one embodiment a light emitting device includes an active layer; a first conductive semiconductor layer on the active layer; a second conductive semiconductor layer on the active layer so that the active layer is disposed between the first and second conductive semiconductor layers; and a photonic crystal structure comprising a first light extraction pattern on the first conductive semiconductor layer having a first period, and second light extraction pattern on the first conductive semiconductor layer having a second period, the first period being greater than $\lambda/n$, and the second period being identical to or smaller than $\lambda/n$, where n is a refractive index of the first conductive semiconductor layer, and $\lambda$ is a wavelength of light emitted from the active layer.

In another embodiment, a light emitting device includes an active layer; a first conductive semiconductor layer on the active layer; a second conductive semiconductor layer on the active layer so that the active layer is disposed between the first and second conductive semiconductor layers; a non-conductive semiconductor layer on the first conductive semiconductor layer; and a photonic crystal structure comprising a first light extraction pattern on the non-conductive semiconductor layer having a first period, and a second light extraction pattern on the non-conductive semiconductor layer having a second period, the first period being greater than $\lambda/n$, and the second period being identical to or smaller than $\lambda/n$, where n is a refractive index of the non-conductive semiconductor layer, and $\lambda$ is a wavelength of light emitted from the active layer.

In another embodiment, a light emitting device includes a light emitting semiconductor layer; a first electrode layer on the light emitting semiconductor layer; a second electrode layer on the light emitting semiconductor layer so that the light emitting semiconductor layer is disposed between the first and second electrode layers; and a photonic crystal structure comprising a first light extraction pattern having a first period on an average in a traveling direction of light emitted from the light emitting semiconductor layer, and a second light extraction pattern having a second period on an average, the first period being greater than $\lambda/n$, and the second period being identical to or smaller than $\lambda/n$, where n is a refractive index of a material comprising the photonic crystal structure, and $\lambda$ is a wavelength of the light emitted from the light emitting semiconductor layer.

DETAILED DESCRIPTION OF THE EMBODIMENTS

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not necessarily reflect an actual size thereof.

Hereinafter, a light emitting device and a method of manufacturing the light emitting device will be described in detail with reference to the accompanying drawings.

Figure 1:
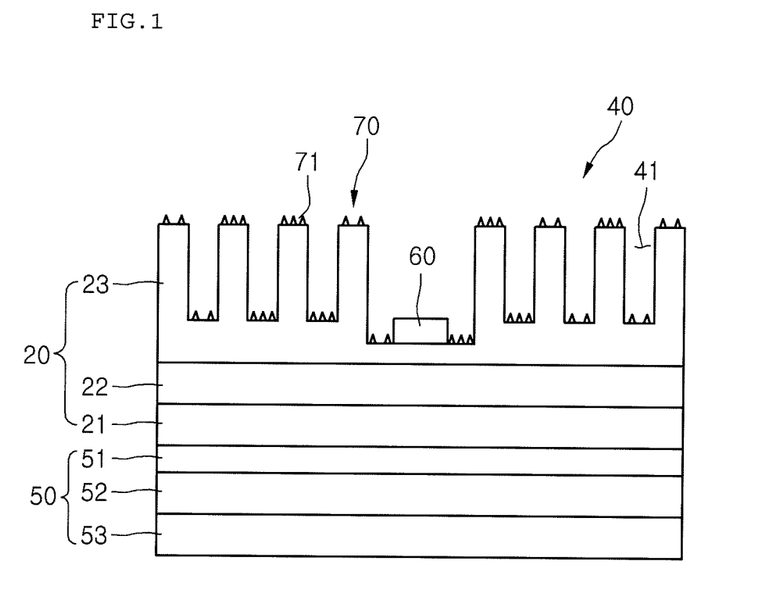
FIG. 1 is a view illustrating a light emitting device according to a first embodiment of the present invention.

FIG. 1 is a view illustrating a light emitting device according to a first embodiment of the present invention.

Referring to FIG. 1, the light emitting device includes a second electrode layer 50, a light emitting semiconductor layer 20, and a first electrode layer 60. The light emitting semiconductor layer 20 is formed on the second electrode layer 50. The first electrode layer 60 is formed on the light emitting semiconductor layer 20.

The second electrode layer 50 may include an ohmic contact layer 51, a reflection layer 52, and a conductive substrate 53. For example, the conductive substrate 53 may be formed of at least one of Cu, Ti, Cr, Ni, Al, Pt, Au, W, and a conductive semiconductor material. The reflection layer 52 may be formed of at least one of Ag, Al, Cu, and Ni, which has high reflectance. The ohmic contact layer 51 may be formed of a transparent electrode layer, for example, at least one of ITO, ZnO, $RuO_x$, $TiO_x$, and $IrO_x$.

The light emitting semiconductor layer 20 includes a first conductive semiconductor layer 23, an active layer 22, and a second conductive semiconductor layer 21. The light emitting semiconductor layer 20 may be formed of a GaN-based semiconductor layer. Here, when the first conductive semiconductor layer 23 is an N-type semiconductor layer, the second conductive semiconductor layer 21 may be a P-type semiconductor layer. When the first conductive semiconductor layer 23 is a P-type semiconductor layer, the second conductive semiconductor layer 21 may be an N-type semiconductor layer.

A first electrode layer 60 is formed on the first conductive semiconductor layer 23. The first electrode layer 60 provides power to the active layer 22 in conjunction with the second electrode layer 50.

On the other hand, a photonic crystal (or a photonic crystal structure) is formed on the first conductive semiconductor layer 23 to increase a light extraction efficiency.

The photonic crystal includes a first light extraction pattern 40 including a plurality of holes 41 formed in the first conductive semiconductor layer 23 at (or having) a first period, and a second light extraction pattern 70 including a plurality of minute protrusions 71 on the first conductive semiconductor layer 23 at (or having) a second period.

Although it is described as an example in FIG. 1 that the holes 41 and the minute protrusion 71 are periodically formed in the first light extraction pattern 40 and the second light extraction pattern 70 by etching the first conductive semiconductor layer 23, respectively, such is not required, and protrusions may be formed as the first light extraction pattern 40, or minute holes may be formed as the second light extraction pattern 70.

In the embodiment, the holes 41 have a depth of about 225 nm, but such is not required, and the holes 41 have may have a depth that is varied according to design, or other depths.

The plurality of minute protrusion 71 may be formed by wet-etching or dry-etching the first conductive semiconductor layer 23 where the first light extraction pattern 40 is formed, or may be formed through a coating, a vapor deposition, a growth process, or another process.

The plurality of minute protrusions 71 in the second light extraction pattern 70 of FIG. 1 are formed using Ag. For example, the plurality of minute protrusions 71 may be formed by etching the first conductive semiconductor layer 23 using Ag as a mask. Here, when Ag is deposited in a thin thickness of about 10 nm, Ag (such as Ag atoms or particles) becomes partially stuck to each other. This is referred to as a clustering effect.

Figure 6:
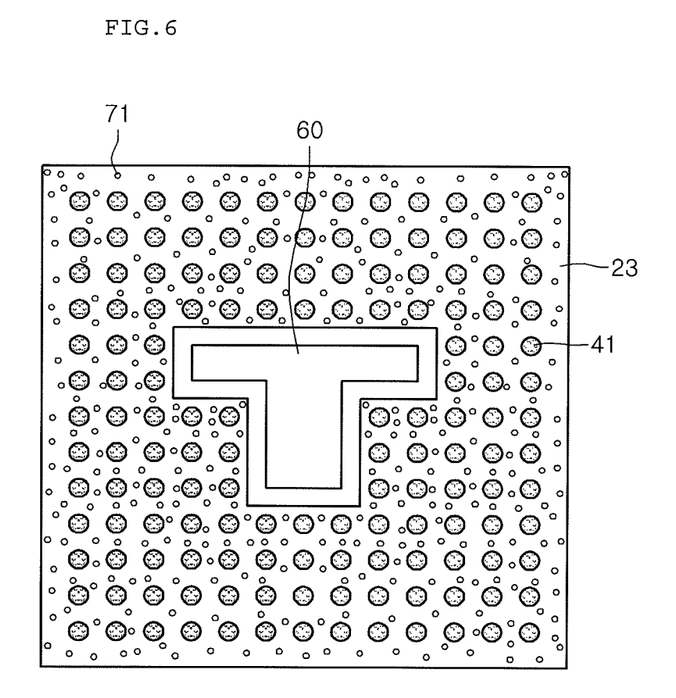
FIG. 6 is a view illustrating the light emitting device of FIG. 1.

FIG. 6 is a plan view illustrating the light emitting device of FIG. 1.

As illustrated in FIG. 6, the first light extraction pattern 40 includes the plurality of holes 41 that are disposed at (or having) a first period on the average, and the second light extraction pattern 70 includes the plurality of minute protrusions 71 that are disposed at (or having) a second period on the average. The first period (or the first period on the average) refers to a mean value of distances between the centers of the plurality of holes 41 that are adjacent. The second period (or the second period on the average) refers to a mean value of distances between the centers of the plurality of minute protrusions 71 that are adjacent. In other embodiments, the first period and/or the second period may be predetermined. Similarly, reference to an average The first light extraction pattern 40 may be regularly disposed (or formed regularly), and the second light extraction pattern 70 may be irregularly disposed (or formed irregularly).

In the embodiment, the first period is designed to be greater than $\lambda/n$, and the second period is designed to be identical to or smaller than $\lambda/n$. Here, n is the refractive index of the first conductive semiconductor layer 23, and $\lambda$ is the wavelength of light emitted from the active layer 22. Light extraction efficiency of light emitted from the active layer 22 that is extracted to the outside through the first conductive semiconductor layer 23 may depend on the photonic crystal. For example, when a light extraction pattern period of the photonic crystal is greater than $\lambda/n$, light having an incident angle greater than a critical angle may be more efficiently extracted. When a light extraction pattern period of the photonic crystal is identical to or smaller than $\lambda/n$, light having an incident angle less than the critical angle may be more efficiently extracted.

The light emitting device according to the embodiment may maximize the light extraction efficiency by including a first light extraction pattern 40 formed at (or having) the first period, and a second light extraction pattern 70 formed at (or having) the second period.

In particular, the second light extraction pattern 70 where the light extraction pattern period of the photonic crystal is identical to or smaller than $\lambda/n$ has an anti-reflective coating effect on an incident light having a critical angle or less to allow light emitted from the active layer 22 to be effectively extracted.

In example embodiments of the present invention, when the first conductive semiconductor layer 23 is GaN, the refractive index n may be about 2.2 to about 2.3. In example embodiments of the present invention, the wavelength of light $\lambda$ emitted from the active layer 22 may be about 450 nm to about 490 nm. In other embodiments, other wavelengths of light $\lambda$ may be emitted from the active layer 22 depending on a refractive index of a material that is used for the first conductive semiconductor layer 23.

Figure 7:
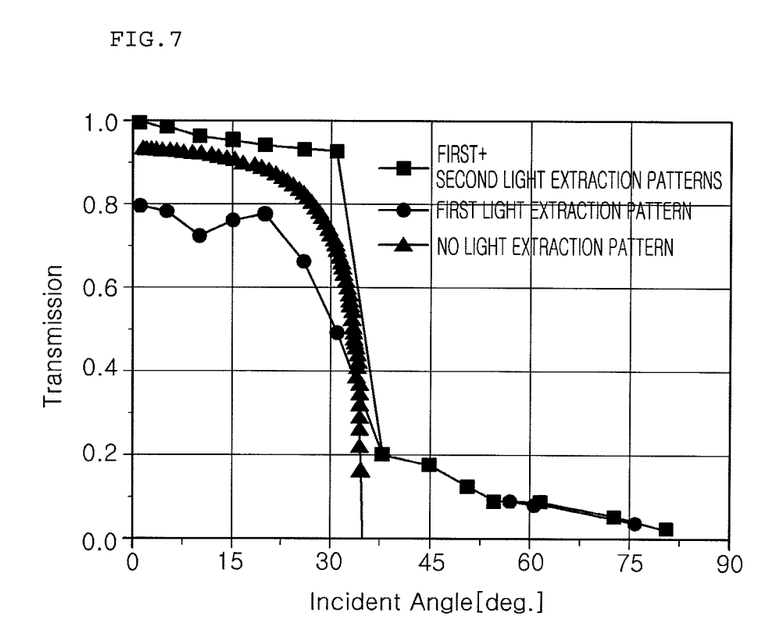
FIG. 7 is graph illustrating an incident angle and a transmittance of light incident to a photonic crystal in a light emitting device according to an embodiment of the present invention.
Figure 8:
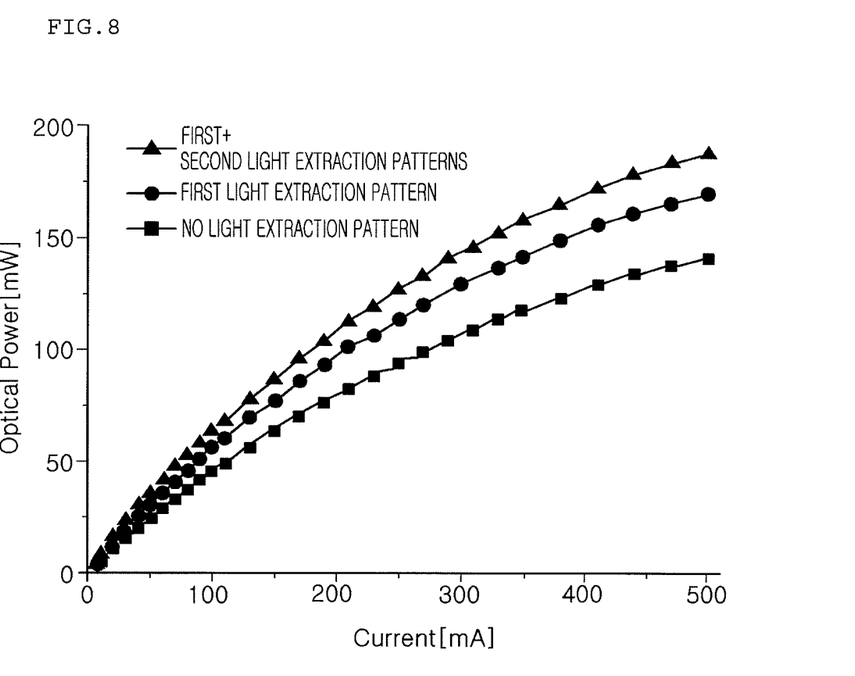
FIG. 8 is a graph illustrating a variation of an optical power with respect to a current strength in a light emitting device according to an embodiment of the present invention.

FIG. 7 is a graph illustrating an incident angle and a transmittance of light entered into a photonic crystal in a light emitting device according to an embodiment of the present invention. FIG. 8 is a graph illustrating a variation of an optical power with respect to the current strength in a light emitting device according to an embodiment of the present invention.

FIGS. 7 and 8 show three cases, including a case having no photonic crystal, a case having a first light extraction pattern, and a case having first and second extraction patterns.

In a light emitting device including no photonic crystal, when an incident angle of light emitted to the outside through the top surface of the first conductive semiconductor layer ranges from zero to a critical angle, its maximum transmittance is about 0.9 at the incident angle of 0°. Here, transmittance is significantly reduced as the incident angle approaches the critical angle. The critical angle is about 35°. When the incident angle is greater than the critical angle, light is not transmitted.

In a light emitting device including a first light extraction pattern as a photonic crystal, when an incident angle of light emitted to the outside through the first light extraction pattern ranges from 0° to a critical angle, its transmittance is smaller than that of the light emitting device having no photonic crystal. However, light is transmitted even when the incident angle is greater than the critical angle.

In a light emitting device including first and second light extraction patterns as a photonic crystal, when an incident angle of light emitted to the outside through the first and second light extraction patterns ranges 0° to a critical angle, its transmittance is higher than those of the light emitting device having no photonic crystal or the light emitting device having only the first light extraction pattern. Light is transmitted similar to the light emitting device having the first extraction pattern even when the incident angle is greater than the critical angle.

Also, as the current strength increases, the optical power of the light emitting device having the first and second light extraction patterns is greater than those of others.

FIGS. 2 to 5 are views illustrating a light emitting device and a method of manufacturing the same according to a second embodiment of the present invention. To explain the second embodiment, detailed description of parts identical to those of the first embodiment will be omitted.

Figure 5:
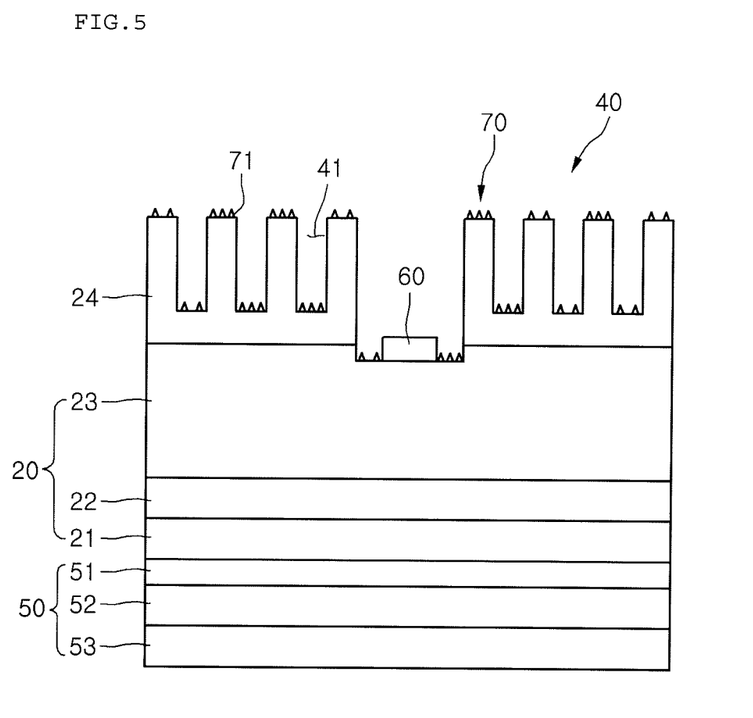

Referring to FIG. 5, the light emitting device according to the second embodiment includes a second electrode layer 50, a light emitting semiconductor layer 20, a first electrode layer 60, and a non-conductive semiconductor layer 24. The light emitting semiconductor layer 20 is formed on the second electrode layer 50. The first electrode layer 60 is formed on the light emitting semiconductor layer 20. The non-conductive semiconductor layer 24 is also formed on the light emitting semiconductor layer 20.

The second electrode layer 50 includes an ohmic contact layer 51, a reflection layer 52, and a conductive substrate 53. For example, the conductive substrate 53 may be formed of at least one of Cu, Ti, Cr, Ni, Al, Pt, Au, W, and a conductive semiconductor material. The reflection layer 52 may be formed of at least one of Ag, Al, Cu, and Ni, which has high reflectance. The ohmic contact layer 51 may be formed of a transparent electrode layer, for example, at least one of ITO, ZnO, $RuO_x$, $TiO_x$, and $IrO_x$.

The light emitting semiconductor layer 20 includes a first conductive semiconductor layer 23, an active layer 22, and a second conductive semiconductor layer 21. The light emitting semiconductor layer 20 may be formed of a GaN-based semiconductor layer. Here, when the first conductive semiconductor layer 23 is an N-type semiconductor layer, the second conductive semiconductor layer 21 may be a P-type semiconductor layer. When the first conductive semiconductor layer 23 is a P-type semiconductor layer, the second conductive semiconductor layer 21 may be an N-type semiconductor layer.

A first electrode layer 60 may be formed on the first conductive semiconductor layer 23. The first electrode layer 60 provides power to the active layer 22 in conjunction with the second electrode layer 50.

The non-conductive semiconductor layer 24 refers to a semiconductor layer formed of a material having much smaller electrical conductivity than those of the first and second conductive semiconductor layers 23 and 21. For example, the non-conductive semiconductor layer 24 may be formed of an un-doped GaN layer.

On the other hand, a photonic crystal (or a photonic crystal structure) is formed on the non-conductive semiconductor layer 24 to increase light extraction efficiency.

The photonic crystal includes a first light extraction pattern 40 including a plurality of holes 41 formed in the non-conductive semiconductor layer 24, and a second light extraction pattern 70 including a plurality of minute protrusions 71 on the non-conductive semiconductor layer 24. Also, the second light extraction pattern 70 may be formed on a portion of the first conductive semiconductor layer 23.

Unlike the first embodiment, the first and second light extraction patterns 40 and 70 are formed on the non-conductive semiconductor layer 24 in the light emitting device according to the second embodiment.

When the first light extraction pattern 40 is formed on the non-conductive semiconductor layer 24, the depth of the holes 41 can be increased. Although not shown in the drawings, the first light extraction pattern 40 can be formed by etching the non-conductive semiconductor layer 24 and the first conductive semiconductor layer 23 to increase the depth of the holes 41.

When the first and second light extraction patterns 40 and 70 are formed on the non-conductive semiconductor layer 24, an etched region of the first conductive semiconductor layer 23 is reduced. Accordingly, the first conductive semiconductor layer 23 can be reduced or prevented from being damaged during an etching process.

Hereinafter, the method of manufacturing the light emitting device according to the second embodiment will be described in detail with reference to FIGS. 2 to 5.

Figure 2:
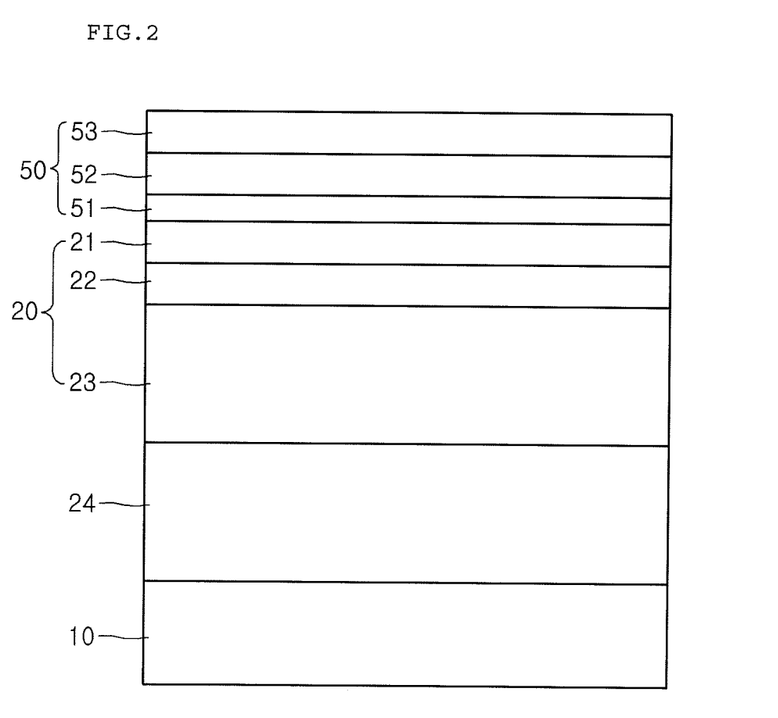
FIGS. 2 to 5 are views illustrating a light emitting device and a method of manufacturing the same according to a second embodiment of the present invention.

Referring to FIG. 2, a non-conductive semiconductor layer 24 is formed on the growth substrate 10. A light emitting semiconductor layer 20 and a second electrode layer 50 is formed on the non-conductive semiconductor layer 24.

For example, the growth substrate 10 may be formed of a sapphire substrate. A buffer layer may be interposed between the growth substrate 10 and the non-conductive semiconductor layer 24.

The non-conductive semiconductor layer 24 may be formed of an un-doped GaN layer.

Figure 3:
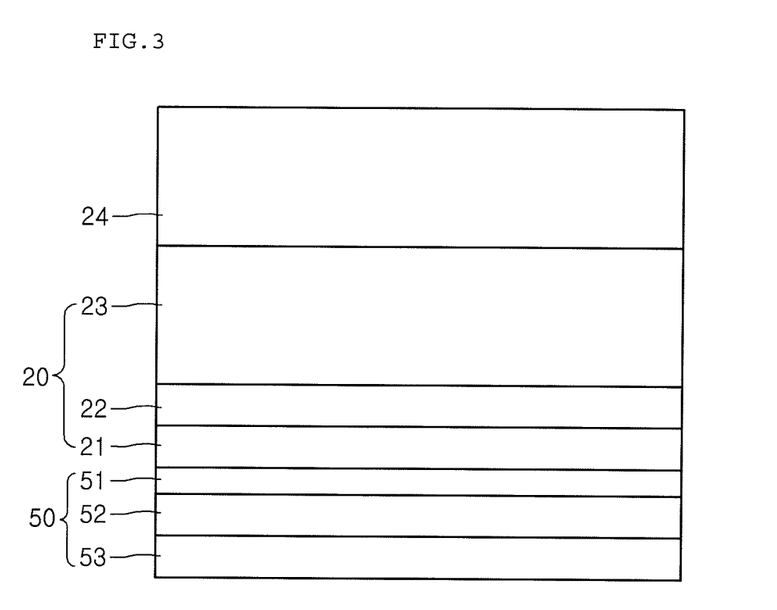

Referring to FIG. 3, the growth substrate 10 is removed from the non-conductive semiconductor layer 24. For example, the growth substrate 10 may be removed through a laser absorption method. Other removal methods may include a laser ablation method or a liftoff method.

Figure 4:
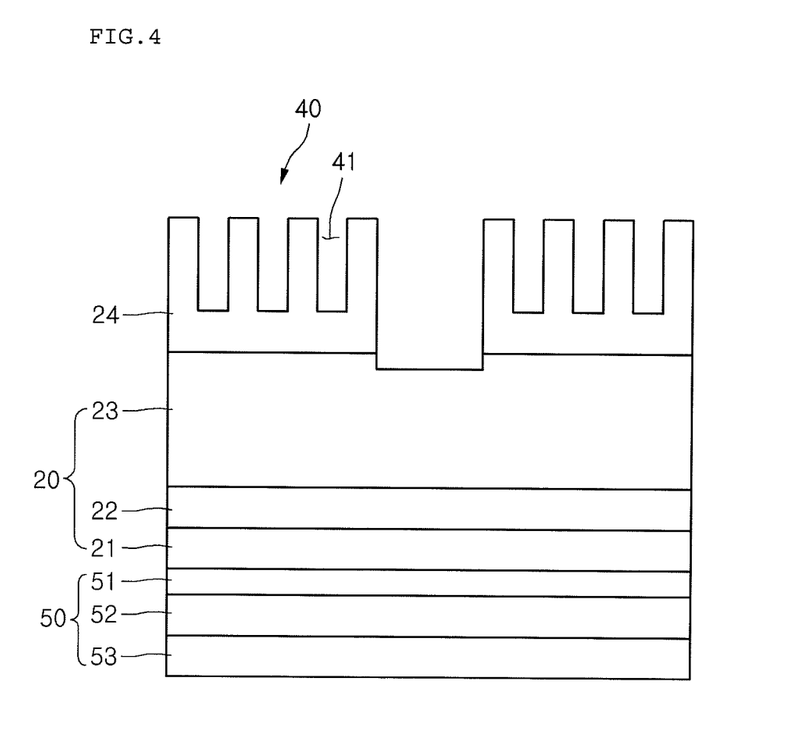

Referring to FIG. 4, a first light extraction pattern 40 is formed by selectively removing the non-conductive semiconductor layer 24. The non-conductive semiconductor layer 24 and the first conductive semiconductor layer 23 are selectively removed to expose a portion of the first conductive semiconductor layer 23.

Referring to FIG. 5, a second light extraction pattern 70 is realized by forming a plurality of minute protrusions 71 on the first light extraction pattern 40. A first electrode layer 60 is formed on the first conductive semiconductor layer 23.

The plurality of minute protrusions 71 may be formed using a phenomenon where Ag (Ag atoms or particles) become stuck to each other when Ag is deposited in a thin thickness of about 10 nm or less. More specifically, the plurality of minute protrusions 71 may be formed by selectively etching the non-conductive semiconductor layer 24 and/or the first conductive semiconductor layer 23 using the Ag stuck to each other as a mask.

When the growth substrate 10 and the non-conductive semiconductor layer 24 in FIG. 3 are removed, and the first light extraction pattern 40 and the second light extraction pattern 70 are formed, the light emitting device according to the first embodiment described in FIG. 1 can be manufactured. In embodiments of the present invention, the non-conductive semiconductor layer 24 may be GaN, which may be completely free of doping impurities, or may include unintentionally doped impurities.

In example embodiments of the present invention, when the non-conductive semiconductor layer 24 and/or the first conductive semiconductor layer 23 is GaN, the refractive index n may be about 2.2 to about 2.3. In example embodiments of the present invention, the wavelength of light λ emitted from the active layer 22 may be about 450 nm to about 490 nm. In other embodiments, other wavelengths of light λ may be emitted from the active layer 22 depending on a refractive index of a material that is used for the non-conductive semiconductor layer 24 and/or the first conductive semiconductor layer 23.

Any reference in this specification to "one embodiment," "an embodiment," "example embodiment," etc., refers to particular feature, structure, or characteristic described in connection with at least one embodiment of the present invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   an active layer;
   a first conductive semiconductor layer on a first surface of the active layer;
   a first electrode layer on the first conductive semiconductor layer;
   a second conductive semiconductor layer on a second surface of the active layer;
   a first light extraction pattern comprising holes and first protrusions on the first conductive semiconductor layer; and
   a second light extraction pattern comprising second protrusions on the first light extraction pattern,
   wherein the first electrode layer and the second protrusions of the second light extraction pattern are in one hole of the holes, and the second protrusions are disposed between the first electrode layer and the first protrusions of the first light extraction pattern,
   wherein a first flat surface of the first conductive semiconductor layer in the one hole in which the first electrode layer is disposed is lower than second flat surfaces of the first conductive semiconductor layer in other holes of the holes, and
   wherein the second protrusions are disposed on the first and the second flat surfaces.

2. The light emitting device according to claim 1, further comprising:
   a second electrode layer on the second conductive semiconductor layer.

3. The light emitting device according to claim 1, further comprising:
   an ohmic layer on the second conductive semiconductor layer,
   wherein the ohmic layer comprises a transparent electrode layer.

4. The light emitting device according to claim 1, wherein the holes of the first light extraction pattern have different depths.

5. The light emitting device according to claim 4, wherein a depth of the one hole is greater than a depth of respective remaining holes.

6. The light emitting device according to claim 4, wherein a first thickness of the first conductive semiconductor layer that corresponds to the one hole is thinner than a second thickness of the first conductive semiconductor layer that corresponds to the respective remaining holes.

7. The light emitting device according to claim 1, wherein a bottom surface of the first electrode layer is lower than an inner top surface of the respective remaining holes.

8. The light emitting device according to claim 7, wherein the second protrusions are disposed on top surfaces of the first protrusions.

9. The light emitting device according to claim 1, wherein a size of the one hole is greater than a size of the respective remaining holes.

10. The light emitting device according to claim 1, wherein the first protrusions have rectangular cross sections.

11. The light emitting device according to claim 1, wherein the first protrusions are physically connected to one another.

12. The light emitting device according to claim 1, wherein adjacent first protrusions surround respective holes.

13. The light emitting device according to claim 1, wherein the first protrusions isolate the respective holes.

14. A light emitting device, comprising:
    an active layer;
    a first conductive semiconductor layer on a first surface of the active layer and comprising a first hole;
    a first electrode layer on the first conductive semiconductor layer;
    a second conductive semiconductor layer on a second surface of the active layer;
    a non-conductive semiconductor layer on the first conductive semiconductor layer;
    a first light extraction pattern comprising second holes and first protrusions on the non-conductive semiconductor layer, one hole of the second holes being overlapped with the first hole;
    a second light extraction pattern comprising second protrusions on the first light extraction pattern,
    wherein the first electrode layer and the second protrusions of the second light extraction pattern are in the first hole, and the second protrusions are disposed between the first electrode layer and the first protrusions of the first light extraction pattern,
    wherein the first electrode layer is disposed in the first hole and the first electrode layer is lower than flat surfaces of the non-conductive semiconductor layer in the second holes, and
    wherein the second protrusions are disposed on a flat surface of the first conductive semiconductor layer in the first hole and the flat surfaces of the non-conductive semiconductor layer in the second holes.

15. The light emitting device according to claim 14, further comprising:
    a second electrode layer on the second conductive semiconductor layer.

16. The light emitting device according to claim 14, further comprising:
    an ohmic layer on the second conductive semiconductor layer,
    wherein the ohmic layer comprises a transparent electrode layer.

17. The light emitting device of claim 14, wherein the non-conductive semiconductor layer comprises an un-doped GaN layer.

* * * * *